(12) United States Patent
Arakawa et al.

(10) Patent No.: US 6,472,734 B2
(45) Date of Patent: Oct. 29, 2002

(54) STACKED SEMICONDUCTOR DEVICE AND METHOD FOR MANUFACTURING THE SAME

(75) Inventors: Masayuki Arakawa; Yasuhito Saito; Naotake Watanabe, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/799,621

(22) Filed: Mar. 7, 2001

(65) Prior Publication Data

US 2001/0020742 A1 Sep. 13, 2001

(30) Foreign Application Priority Data

Mar. 8, 2000 (JP) ........................................ 2000-063873

(51) Int. Cl.⁷ ........................... H01L 23/02; H01L 29/40
(52) U.S. Cl. ..................... 257/686; 257/686; 257/777
(58) Field of Search .......................... 257/686, 685, 257/723, 778, 737; 438/109

(56) References Cited

U.S. PATENT DOCUMENTS 5,490,324 A * 2/1996 Newman ..................... 29/830
6,291,259 B1 * 9/2001 Chun .......................... 438/106
6,172,432 B1 * 1/2002 Lee ............................. 257/780

FOREIGN PATENT DOCUMENTS

JP 8-236694 9/1996

* cited by examiner

Primary Examiner—Jasmine J B Clark
(74) Attorney, Agent, or Firm—Oblon, Spivak, McClelland, Maier & Neustadt, P.C.

(57) ABSTRACT

A semiconductor device comprises a first wiring board and a second wiring board, wherein the first wiring board includes a first semiconductor element arranged on the underside of the first wiring board, and a second connecting section formed on the underside of the first wiring board, the second wiring board includes a second semiconductor element, and a third connecting section formed on the surface of the second wiring board, the second connecting section has a first external connecting land, the third connecting section is arranged opposite to the first external connecting land and has a second external connecting land which is smaller than the first external connecting land, and the second and third connecting sections are formed such that a combined thickness thereof provides a given space between the first semiconductor element and the second wiring board.

10 Claims, 5 Drawing Sheets

STACKED SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2000-063873, filed Mar. 8, 2000, the entire contents of which are incorporated herein by reference.

BACKGROUND OF THE INVENTION

The present invention relates to a semiconductor device that is favorable for stacking semiconductor packages and a method for manufacturing the semiconductor device.

The market for small-sized memory cards equipped with a flash memory, which are used as digital still cameras and personal digital assistants, has recently increased fast. Particularly in the field of digital cameras, the memory cards are going mainstream and establishing themselves as an alternative to MD and floppy disks.

Against the above background, it is required that the small-sized memory cards, which are constituted of only flash memories, should increase in capacity, reduce in size and decrease in cost. Various structures for packaging and mounting memory ICs are therefore proposed.

Generally, a method of soldering a thin mold package such as TSOP (thin small outline package) to a base board and a method of directly connecting a bare chip to a base board using wire bonding, flip chip bonding or the like are adopted. Since, however, the storage capacity depends upon the chip size, the packaging technique of stacking chips three-dimensionally should be adopted to increase the capacity further.

Figure 5:
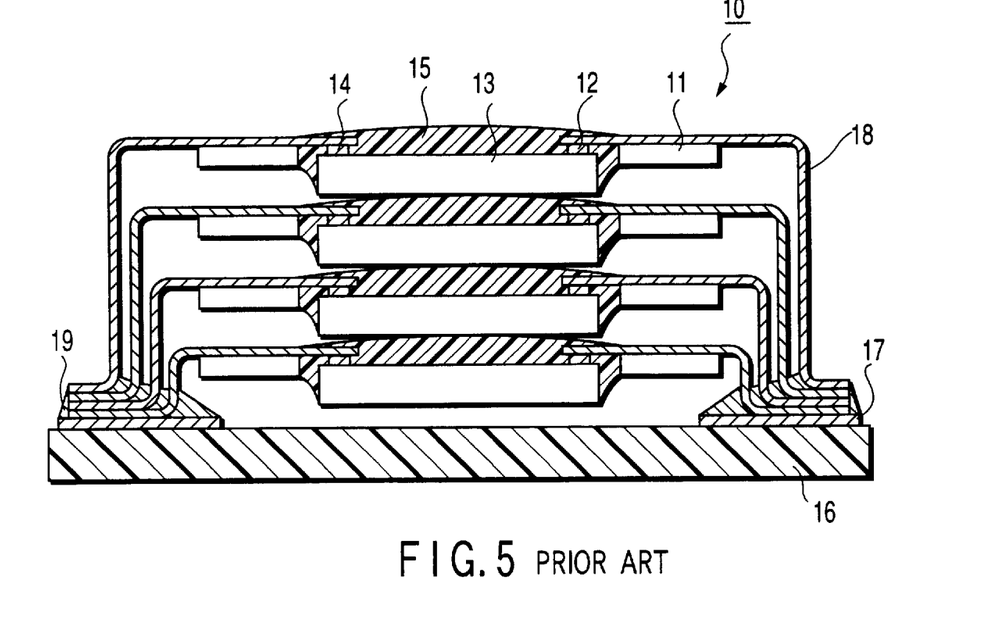
FIG. 5 is a cross-sectional view showing an example of a prior art semiconductor device.

FIG. 5 shows a prior art semiconductor device 10 having a stacked packaging structure wherein four semiconductor elements, which are packaged by a so-called TAB (tape automated bonding) method, are connected to a base board.

In the semiconductor device 10, four semiconductor elements 13 are each connected to a given portion of a copper-made wiring pattern 12, which is formed on a polyimide wiring board 11, through a gold-made bump 14 by thermocompression bonding, ultrasonic bonding or the like. Each semiconductor element 13 is sealed with resin 15, such as epoxy resin, so as to cover its top and sides. After the four semiconductor elements 13 are packaged in the same manner, these four packages are stacked on a connection land 17 of a base board 16, and leads 18 for connecting the packages to an external device are connected to each other in sequence or together by means of a connection member 19, e.g., solder.

In order to connect the four packages to the base board 16, the connecting leads 18 need to be formed. In this case, the leads should be formed into different shapes because they need to be aligned with their respective levels of the four packages.

When four packages are stacked on one another, the following problem occurs: Four different forming molds are required and the forming models produce four different packages. Therefore, the process control is complicated and the manufacturing cost is high.

When four memory ICs are stacked one on another, the following problem occurs: All terminals except a chip select terminal serve as a common terminal and thus four connecting leads 18 should be stacked and connected to each other. In this case, a misalignment of the stacked leads easily causes poor connection and reduces the yield. In order to enhance the yield, there is a method of connecting the leads 18 to the baseboard 16 such that the leads 18 are displaced from each other. Since, however, four connecting leads 18 are arranged in parallel, the area of connecting portions necessary for packaging is simply quadrupled, and a narrow pitch is difficult to obtain.

The prior art stacked packaging structure has another problem that a semiconductor device is difficult to miniaturize since a space for forming the connecting leads 18 is required.

Figure 6:
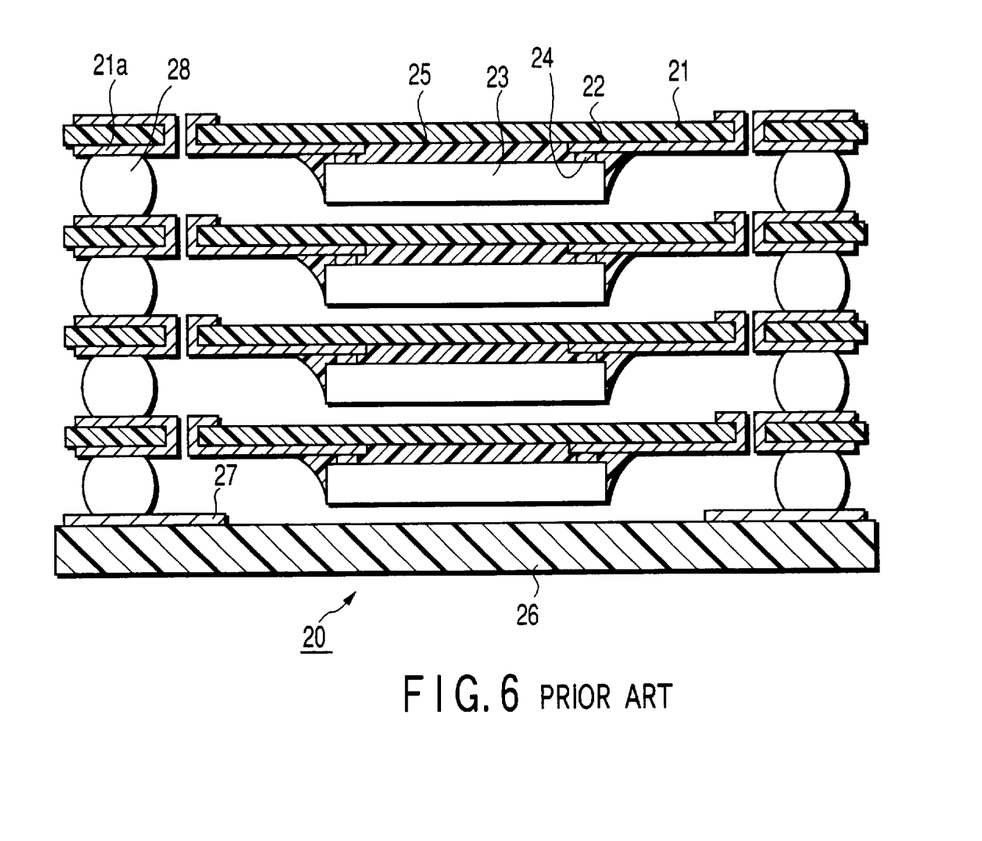
FIG. 6 is a cross-sectional view showing another example of the prior art semiconductor device.

In order to achieve the above miniaturization and narrow pitch, there is a method of connecting the respective packages using not connecting leads but bumps. FIG. 6 is a view illustrating a semiconductor device 20 in which an IC chip is mounted on a thin printed board by flip chip bonding.

In the semiconductor device 20, four semiconductor elements 23 are each connected to a given portion of a copper-made wiring pattern 22, which is formed on a polyimide wiring board 21, through a gold-made bump 24 by flip chip bonding. Each semiconductor element 23 is sealed with resin 15, such as epoxy resin, so as to cover a space between the element 23 and the wiring board 21 and the sides of the element 13. After the four semiconductor elements 23 are packaged in the same manner, these four packages are stacked on a connection land 27 of a base board 26 with a connecting member 28, e.g., a solder ball, interposed therebetween. Connection lands 21a are formed on both sides of the wiring board 21 and connected to each other by reflow and thermocompression bonding.

When the respective packages are connected by solder, a solder ball can be employed or solder paste can be formed by printing as a solder supply method. In either case, the process is stabilized if the packages are connected using solder that is melted into a bump by reflow.

However, the following problem arises: Passing the semiconductor elements through a reflow furnace exercises an adverse influence on the stability and reliability of the subsequent process, e.g., damage to the connecting portions of the semiconductor elements and a warp of the wiring board.

The above-described prior art semiconductor device and its manufacturing method have the following problems: Since the stacked packages need to vary in shape from one to another, the process control is complicated. Since, moreover, the stacked packages are connected by leads, miniaturization and a narrow pitch are difficult to obtain in the semiconductor device.

When the packages are connected by bumps, they need to pass through the reflow furnace, which exercises an adverse influence on the stability and reliability of the subsequent process, e.g., damage to the connecting portions of the elements and a warp of the wiring board. When the packages are connected by plated bumps, solder is unmelted or overflows and a solid metal bump made of, e.g., copper is hardly deformed, thus making the connection of the packages unstable.

BRIEF SUMMARY OF THE INVENTION

An object of the present invention is to provide a semiconductor device that can be decreased in size and pitch and manufactured in a stable process.

According to one aspect of the present invention, there is provided a semiconductor device in which a first semiconductor element and a second connecting section having a first external connection land are arranged on a first wiring board toward a second wiring board, a third connecting section is formed on the surface of the second wiring board toward the first wiring board and arranged opposite to the first external connection land, the second connecting section includes the first external connection land, the third connecting section is arranged opposite to the first external connection land and includes a second external connection land that is smaller than the first external connection land, and the second and third connecting sections are formed such that a combined thickness thereof provides a given space between the first semiconductor element and the second wiring board.

According to the present invention described above, since the connecting sections for connecting the wiring boards are formed thick, the wiring boards can be stacked by a simple process without forming any new bumps. The semiconductor device of the present invention can be thinned more than a semiconductor device that is manufactured using newly-added bumps. Consequently, the device can be decreased in size and pitch and manufactured in a stable process without decreasing in yields.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain in the principles of the invention.

DETAILED DESCRIPTION OF THE INVENTION

Embodiments of the present invention will now be described with reference to the accompanying drawings.

Figure 1A:
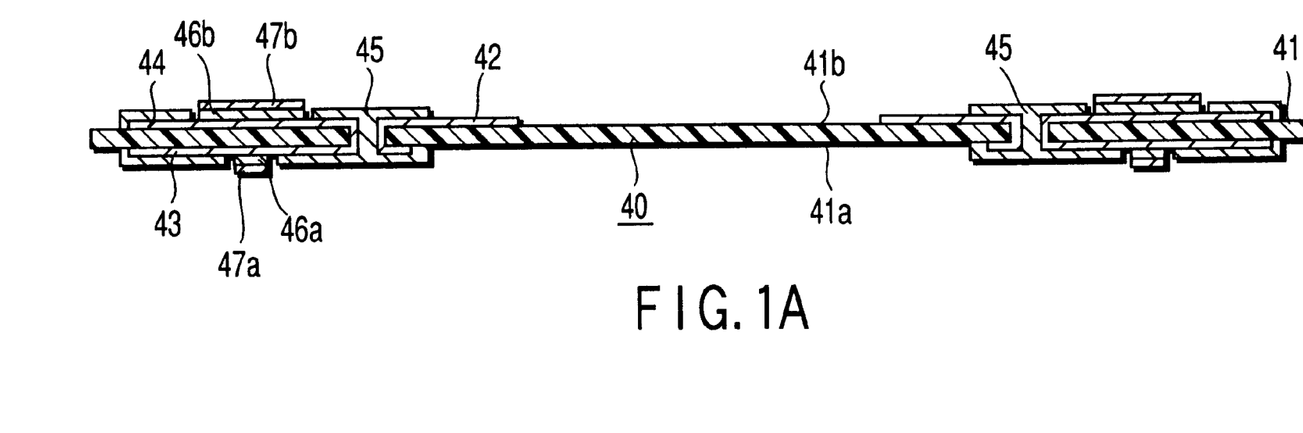
FIGS. 1A and 1B are cross-sectional views showing a process of manufacturing a semiconductor device according to a first embodiment of the present invention.
Figure 1B:
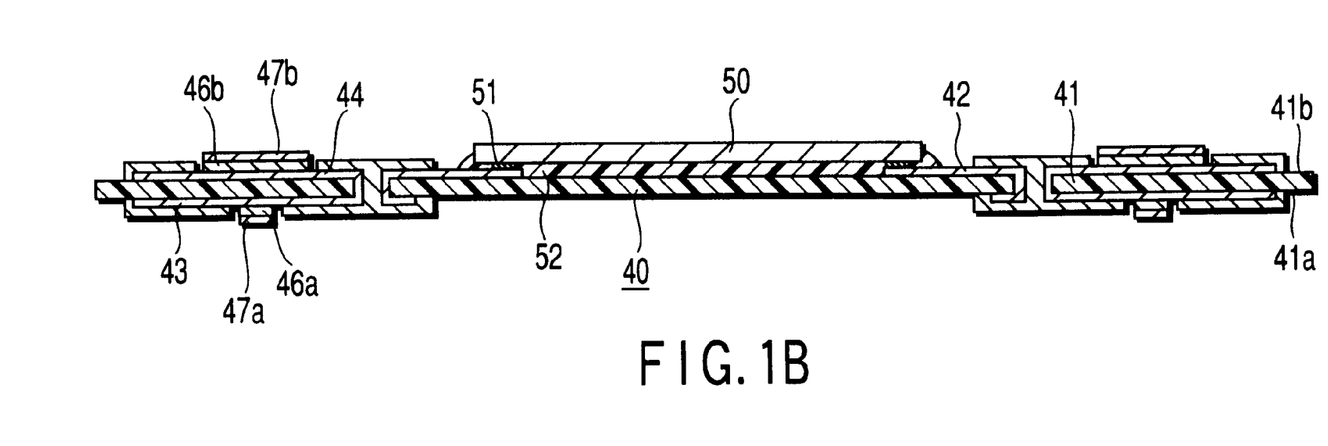
Figure 2A:
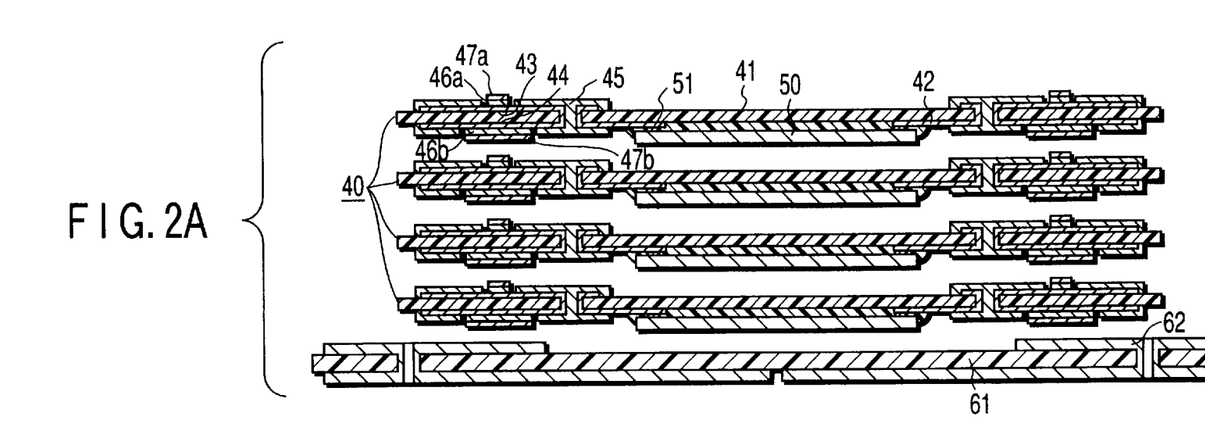
FIGS. 2A and 2B are cross-sectional views showing another process of manufacturing the semiconductor device according to the first embodiment of the present invention.
Figure 2B:
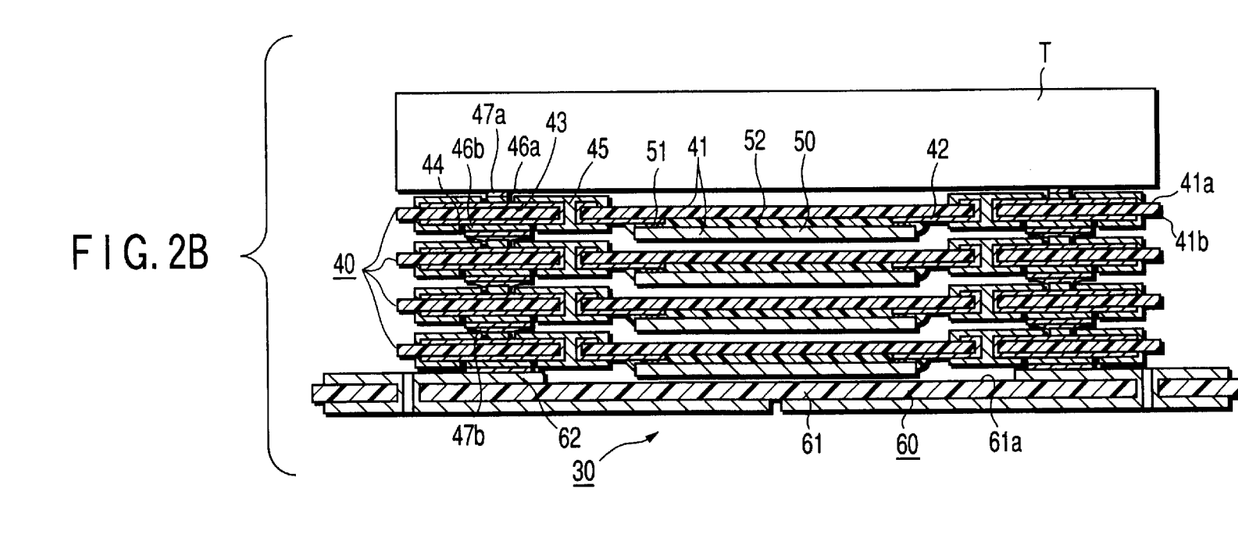

FIGS. 1A, 1B, 2A and 2B are views showing a process of manufacturing a semiconductor device according to a first embodiment of the present invention. FIG. 2B is a cross-sectional view illustrating a semiconductor device 30.

In the semiconductor device 30, four wiring boards (first and second wiring boards) 40 are stacked on a base board 60, as illustrated in FIG. 2B.

Each of the wiring boards 40 includes a board member 41 using polyimide material having a flexibility and a thickness of 25 $\mu$m. In the figures, reference numeral 41a indicates the surface of the board member 41 and numeral 41b denotes the underside thereof. A wiring pattern 42 of copper having a thickness of 18 $\mu$m is formed on the underside 41b of the board member 41. A connection land (first connection land) 43 having a diameter of 100 $\mu$m is formed on the surface 41a of the board member 41 to connect the wiring board 40 to an external device. Another connection land (second connection land) 44 having a large diameter of 500 $\mu$m is formed on the underside 41a of the member 41 to connect the wiring board 40 to the external device. The connection lands 43 and 44 are formed opposite to each other and connected via a through hole 45.

A small-diameter plated bump 46a and a large-diameter plated bump 46b are formed on their respective connection lands 43 and 44 by plating. These bumps are made of copper, nickel or the like whose thickness is 20 $\mu$m to 40 $\mu$m. Furthermore, solder layers 47a and 47b having thicknesses of 10 $\mu$m to 20 $\mu$m are formed on their respective bumps 46a and 46b by plating.

A semiconductor element 50, which is as thin as 50 $\mu$m, is flip-chip-connected to the wiring pattern 42 through a gold-made bump 51 having a height of 10 $\mu$m to 30 $\mu$m. In the flip-chip connection, an anisotropic conductive film (ACF) 52 containing conductive particles dispersed in resin, is interposed between the wiring pattern 42 and the semiconductor element 50 to electrically connect them by thermocompression bonding at a temperature of 180° C. and seal them with the resin. The flip-chip connection can be replaced with another method such as solder connection and compression bonding.

The base board 60 includes a board member 61 with a surface 61a. A connection land 62 having a diameter of 500 $\mu$m is formed on the surface 61a to connect the base board 60 to the external device.

The semiconductor device 30 so constituted is manufactured as follows: As shown in FIG. 1A, a wiring pattern 42, connection lands 43 and 44, and a through hole 45 are formed on a board member 41. Then, plated bumps 46a and 46b are formed on their respective connection lands 43 and 44 by plating, as are solder layers 47a and 47b.

As illustrated in FIG. 1B, a semiconductor element 50 is packaged on the wiring pattern 42 of the board member 41. Four wiring boards 40 so constituted are prepared.

The four wiring boards 40 are connected to a base board 60 by plating and soldering in the same manner as when the four wiring boards 40 are connected to each other.

As shown in FIG. 2A, the connection land 44 of one (upper) wiring board 40 is aligned with the connection land 43 of another (lower) wiring board 40. Similarly, the four wiring boards 40 are mounted on each other. Then, thermocompression bonding is performed from above the connection land 43 of the uppermost wiring board 40 using a heater tool T having a temperature of about 250° C. The solder layers 47a and 47b are thus melted and all the wiring boards are electrically connected to each other, as shown in FIG. 2B.

The solder of the melted solder layers 47a and 47b does not greatly overflow from the large-diameter plated bump 46b in order to form a fillet in the small-diameter plated bump 46a. No short circuit occurs between the plated bumps 46a and 46b.

The connection lands 43 and 44, plated bumps 46a and 46b, and solder layers 47a and 47b each have a thickness to provide a fixed space between the semiconductor element 50 of the (upper) wiring board 40 and the board member 41 of the (lower) wiring board 40 when the solder layers 47a and 47b are melted and coagulated. Therefore, the semiconductor element 50 and the wiring board 40 do not interfere with each other even though they are bonded to each other.

In the semiconductor device 30 constituted as described above, the thickness of the packaging section of the semiconductor element 50 ranges from 80 $\mu$m to 100 $\mu$m and the interval between the wiring boards 40 ranges from 100 $\mu$m to 160 $\mu$m. The semiconductor element 50 is held in the space between the wiring boards 40.

Since the wiring boards 40 are stacked one on another using the connection lands 43 and 44 formed on the boards 40, the semiconductor device 30 can be thinned and miniaturized. Since the connection lands 43 and 44 can be formed like an area, they can be applied to a multi-pin semiconductor element.

Since, moreover, the connection lands 43 and 44 can be formed in the process of manufacturing the wiring boards 40, no connecting bumps need to be formed and thus the packaging process can be simplified. Consequently, the semiconductor device can be manufactured at high yields.

In the foregoing first embodiment, the wiring boards are connected by solder. If anisotropic conductive paste is employed, the small and large-diameter plated bumps 46b and 46a are opposed and connected to each other. A load per unit area is therefore increased as compared with the case where large-diameter plated bumps are bonded to each other. The plated bumps 46a and 46b are easily deformed and the bonding can stably be achieved. If small-diameter plated bumps are bonded to each other, a load per unit area becomes equal to that when the large-diameter plated bumps are bonded. It is however difficult to connect four wiring boards together using $\phi$100$\mu$,m-diameter bumps in consideration of a displacement due to the pattern accuracy or the warp of the wiring boards 40. If the wiring boards are connected using both an about-100-$\mu$m-diameter bump 46a and an about 500-$\mu$m-diameter bump 46b, a displacement of about 100 $\mu$m to 200 $\mu$m can be absorbed, and the wiring boards can stably be connected by deformation of the bumps.

Now, the semiconductor element of the above-mentioned embodiment has the thickness, which has flexibility, for example, 50 $\mu$m. Bumps (internal electrodes) having a height of 10–30 $\mu$m, made of gold (Au) or the like, are formed on one surface of the semiconductor element. The semiconductor element is connected to the wiring pattern via the bumps by flip-chip bonding. The 50 $\mu$m-thick semiconductor element is much thinner than the conventional element. Therefore, the semiconductor element has flexibility of being able to bend.

A process for manufacturing the semiconductor device will be described.

First, elements (thin film circuits) are formed on a semiconductor wafer having a thickness of 400 $\mu$m.

Subsequently, that surface of the semiconductor wafer, on which the elements are formed, is half-cut by dicing with a blade to form 140 $\mu$m-deep grooves, lengthwise and crosswise.

Then, the rear surface of the semiconductor wafer, on which the elements are not formed, is uniformly grinded by abrading or lapping, so that the thickness of the semiconductor wafer is reduced.

The grinding process is carried out in the following manner. A covering tape for protecting circuits is adhered to that surface of the semi-conductor wafer on which the elements are formed. The other surface of the semiconductor wafer, on which the elements are not formed, i.e., the rear surface, is ground to reduce the thickness of the semiconductor wafer.

The above grinding process is performed by a vertical-shaft in-feed grinder (not shown). The semiconductor wafer is held by a porous chuck having a smooth plane. During the process, the semiconductor wafer is fixed by evacuation by means of a vacuum pump.

The semiconductor wafer is rotated at the rate of 300 r.p.m and processed by a cup-shaped diamond grinder rotated at the high rate of 3000 r.p.m, while the grinder is cutting in the semiconductor wafer in the thickness direction at a feed rate of about 50 $\mu$m/min. The cup-shaped diamond grinder has a grain size of about #360 to #3000, and thermosetting resin or ceramic is used as a binding agent. As the semiconductor wafer is thinned by the grinding described above, it is divided into semiconductor elements when the grinder reaches the grooves, which have been formed in advance by dicing.

Then, a polishing process using an elastic pad and slurry is carried out, so that the semiconductor elements are thinned to 80 $\mu$m or thinner (in this embodiment 50 $\mu$m). The elastic-pad is made of polyurethane. The slurry comprises fine particles of silica ($SiO_2$) having a grain size of 0.1 $\mu$m or smaller, an amine additive, a dispersing agent and pure water. When the semiconductor elements are thinned to 80 $\mu$m or thinner, it is given flexibility. Therefore, even if force in a bending direction is applied to the elements, brakeage of the elements is suppressed as far as possible.

Further, when the semiconductor elements are polished using the elastic pad and the slurry, a load is concentrated at the element edge portions due to the elastic action of the elastic pad. As a result, the removal rate at the element edge portions is increased, so that the element edge portions can be beveled. Owing to the beveling, brakeage of the elements is further suppressed, even if force in a bending direction is applied to the elements. In addition, since the amine additive has a function of chemically etching the semiconductor elements, the chemical etching action is also provided.

In this way, the obtained semiconductor element does not have simply only the character to be thin. By beveling the semiconductor element, the durability of the semiconductor element related for bending improves. That is, the semiconductor element has flexibility. By combining this flexible semiconductor element and a flexible wiring board, it becomes easy to form thin semiconductor equipment.

Figure 3A:
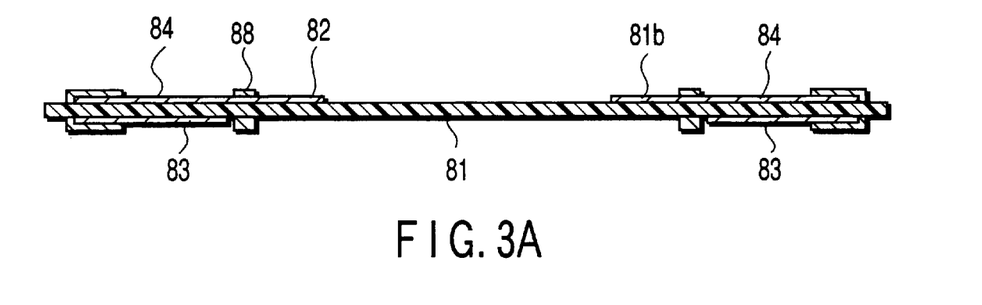
FIGS. 3A to 3C are cross-sectional views showing a process of manufacturing a semiconductor device according to a second embodiment of the present invention.
Figure 3B:
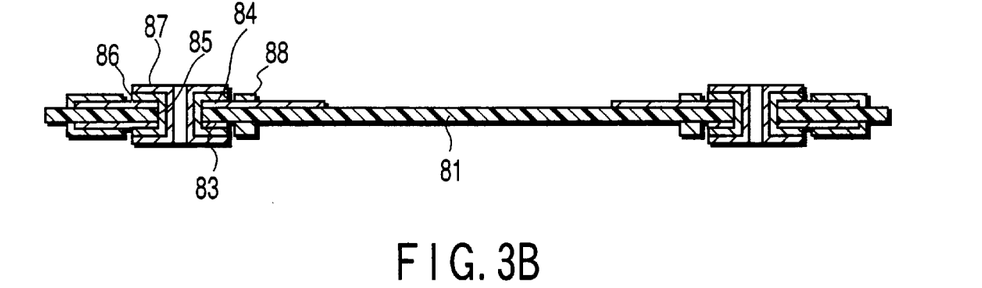
Figure 3C:
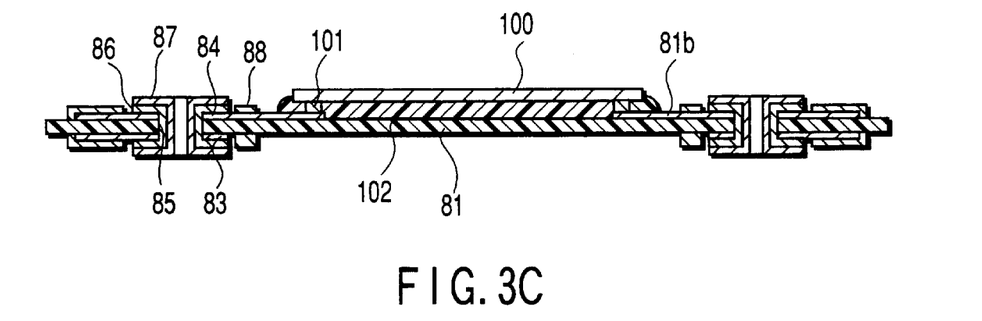
Figure 4A:
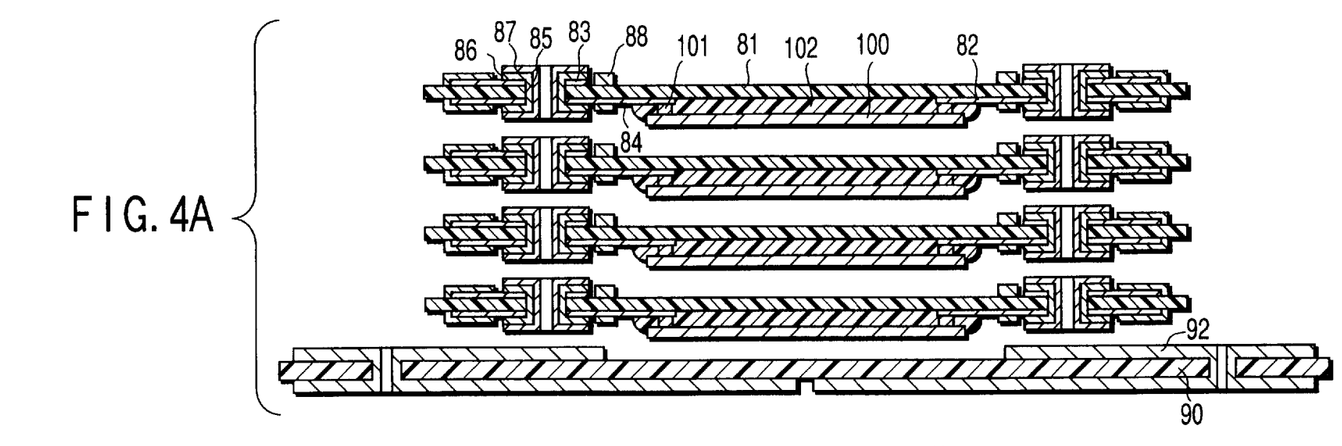
FIGS. 4A and 4B are cross-sectional views showing another process of manufacturing the semiconductor device according to the second embodiment of the present invention.
Figure 4B:
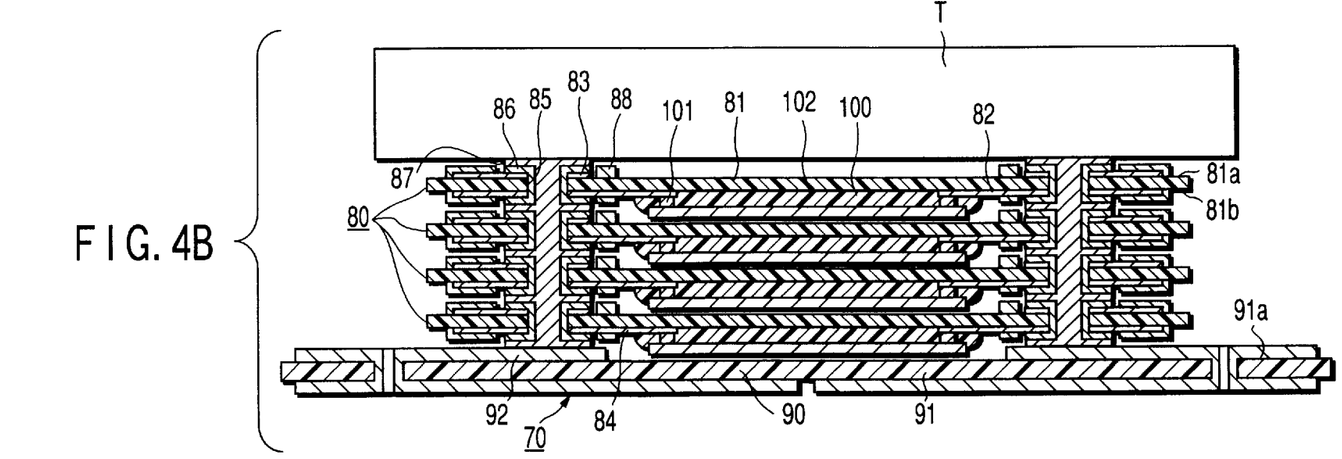

FIGS. 3A to 3C and FIGS. 4A and 4B are views showing a process of manufacturing a semiconductor device according to a second embodiment of the present invention. FIG. 4B is a cross-sectional view illustrating a semiconductor device 70.

In the semiconductor device 70, four wiring boards (first and second wiring boards) 80 are stacked on a base board 90, as illustrated in FIG. 4B.

Each of the wiring boards 80 includes a board member 81 using polyimide material having a thickness of 25 $\mu$m. In the figures, reference numeral 81a indicates the surface of the board member 81 and numeral 81b denotes the underside thereof. A wiring pattern 82 of copper having a thickness of 18 $\mu$m and a connection land 84 for connecting the wiring board to an external device are formed on the underside 81b of the board member 81. Another connection land 83 is formed on the surface 81a of the board member 81 opposite to the connection land 84. The connection lands 83 and 84 are connected to each other via a through hole 85.

A plated bump 86 is formed on the connection lands 83 and 84 by plating. The bump is made of copper, nickel or the like whose thickness is 20 μm to 40 μm. Furthermore, a solder layers 87 having a thickness of 10 μm to 20 μm is formed on the plated bump 86 by plating. In the figures, reference numeral 88 indicates resist.

A semiconductor element 100, which is a chip member as thin as 50 μm, is flip-chip-connected to the wiring pattern 82 through a gold-made bump 101 having a height of 10 μm to 30 μm. In the flip-chip connection, an anisotropic conductive film (ACF) 102 containing conductive particles dispersed in resin, is interposed between the wiring pattern 82 and the semiconductor element 100 to electrically connect them by thermocompression bonding at a temperature of 180° C. and seal them with the resin. The flip-chip connection can be replaced with another method such as solder connection and compression bonding.

The base board 90 includes a board member 91 with a surface 91a. A connection land 92 having a diameter of 500 μm is formed on the surface 91a to connect the base board 90 to the external device.

The semiconductor device 70 so constituted is manufactured as follows: As shown in FIG. 3A, a wiring pattern 82 and connection lands 83 and 84 are formed on a board member 81. Then, as shown in FIG. 3B, a through hole 85 is formed in a position corresponding to the connection lands 83 and 84. A plated bump 86 and a solder layer 87 are formed in the through hole 85 by plating.

As illustrated in FIG. 3C, a semiconductor element 100 is packaged on the wiring pattern 82 of the board member 81. Four wiring boards 80 so constituted are prepared.

The four wiring boards 80 are connected to a base board 90 by plating and soldering in the same manner as when the four wiring boards 80 are connected to each other.

As shown in FIG. 4A, the connection land 84 of one (upper) wiring board 80 is aligned with the connection land 83 of another (lower) wiring board 80. Similarly, the four wiring boards 80 are mounted on each other. Then, thermocompression bonding is performed from above the connection land 83 of the uppermost wiring board 80 using a heater tool T having a temperature of about 250 °± C. The solder layer 87 is thus melted and all the wiring boards are electrically connected to each other, as shown in FIG. 4B.

Since the surplus solder is absorbed in the through hole 85, it does not overflow greatly from the connection lands 83 and 84. Since, furthermore, the through hole 85 is formed in the connection lands 83 and 84, heat conduction becomes good at the time of thermocompression bonding. Even though four wiring boards 80 are stacked one on another, the solder layer 87 can easily be melted sufficiently in all the boards 80.

The connection lands 83 and 84, plated bump 86, and solder layer 87 each have a thickness to provide a fixed space between the semiconductor element 100 of the (upper) wiring board 80 and the board member 81 of the (lower) wiring board 80 when the solder layer 87 is melted and coagulated. Therefore, the semiconductor element 100 and the wiring board 80 do not interfere with each other even though they are bonded to each other.

In the semiconductor device 70 constituted as described above, the thickness of the packaging section of the semiconductor element 100 ranges from 80 μm to 100 μm and the interval between the wiring boards 80 ranges from 100 μm to 160 μm. The semiconductor element 100 is held in the space between the wiring boards 80.

Since the wiring boards 80 are stacked one on another using the connection lands 83 and 84 formed on the boards 80, the semiconductor device 70 can be thinned and miniaturized. Since the connection lands 83 and 84 can be formed like an area, they can be applied to a multi-pin semiconductor element.

Since, moreover, the connection lands 83 and 84 can be formed in the process of manufacturing the wiring boards 80, no connecting bumps need to be formed and thus the packaging process can be simplified. Consequently, the semiconductor device can be manufactured at high yields.

The present invention is not limited to the above embodiments. In the embodiments, the semiconductor elements are connected by flip chip bonding. However, the semiconductor elements can be connected to the board member by die bonding and connected to the wiring pattern through wires. It is needless to say that various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stacked semiconductor device comprising:

a first wiring board; and a second wiring board whose surface is opposed to an underside of the first wiring board, wherein the first wiring board includes a wiring pattern formed on at least one surface of the first wiring board, a first semiconductor element connected to the wiring pattern and arranged on the underside of the first wiring board, a first connecting section formed on the surface of the first wiring board and used to connect the first wiring board to an external device, and a second connecting section formed on the underside of the first wiring board and used to connect the first wiring board to the external device;

the second wiring board includes a wiring pattern formed on at least one surface of the second wiring board, a second semiconductor element connected to the wiring pattern and arranged on an underside of the second wiring board, a third connecting section formed on the surface of the second wiring board and used to connect the second wiring board to the external device, and a fourth connecting section formed on the underside of the second wiring board and used to connect the second wiring board to the external device;

the second connecting section has a first external connecting land;

the third connecting section is arranged opposite to the first external connecting land and has a second external connecting land which is smaller than the first external connecting land; and the second and third connecting sections are formed such that a combined thickness thereof provides a given space between the first semiconductor element and the second wiring board.

2. The stacked semiconductor device according to claim 1, wherein the first and second external connecting lands are obtained by forming a metal layer in a given portion on the wiring pattern.

3. The stacked semiconductor device according to claim 1, wherein the first and second external connecting lands are obtained by forming a plurality of metal layers in a given portion on the wiring pattern, and an uppermost one of the metal layers is a solder layer.

4. The stacked semiconductor device according to claim 1, wherein the first and second external connecting lands are connected to each other through an anisotropic conductive film.

5. The stacked semiconductor device according to claim 1, wherein the semiconductor elements and the wiring boards have flexibility.

6. A stacked semiconductor device comprising:

a first wiring board; and a second wiring board whose surface is opposed to an underside of the first wiring board, wherein the first wiring board includes a wiring pattern formed on at least one surface of the first wiring board, a first semiconductor element connected to the wiring pattern and arranged on the underside of the first wiring board, a first connecting section formed on the surface of the first wiring board and used to connect the first wiring board to an external device, and a second connecting section formed on the underside of the first wiring board, connected to the first connecting section via a through hole, and used to connect the first wiring board to the external device;

the second wiring board includes a wiring pattern formed on at least one surface of the second wiring board, a second semiconductor element connected to the wiring pattern and arranged on an underside of the second wiring board, a third connecting section formed on the surface of the second wiring board and used to connect the second wiring board to the external device, and a fourth connecting section formed on the underside of the second wiring board, connected to the third connecting section via a through hole, and used to connect the second wiring board to the external device; and the second and third connecting sections are formed such that a combined thickness thereof provides a given space between the first semiconductor element and the second wiring board.

7. The stacked semiconductor device according to one of claims 1 and 6, wherein the first and second external connecting lands are obtained by forming a metal layer in a given portion on the wiring pattern.

8. The stacked semiconductor device according to one of claims 1 and 6, wherein the first and second external connecting lands are obtained by forming a plurality of metal layers in a given portion on the wiring pattern, and an uppermost one of the metal layers is a solder layer.

9. The stacked semiconductor device according to one of claims 1 and 6, wherein the first and second external connecting lands are connected to each other through an anisotropic conductive film.

10. The stacked semiconductor device according to claim 6, wherein the semiconductor elements and the wiring boards have flexibility.

* * * * *